US010233325B2

(12) United States Patent
Tsutsumi et al.

(10) Patent No.: US 10,233,325 B2
(45) Date of Patent: Mar. 19, 2019

(54) RESIN COMPOSITION

(71) Applicant: ZEON CORPORATION, Tokyo (JP)

(72) Inventors: Takashi Tsutsumi, Tokyo (JP); Takayuki Saito, Tokyo (JP); Makoto Fujimura, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 15/755,182

(22) PCT Filed: Aug. 25, 2016

(86) PCT No.: PCT/JP2016/074807
§ 371 (c)(1),
(2) Date: Feb. 26, 2018

(87) PCT Pub. No.: WO2017/038619
PCT Pub. Date: Mar. 9, 2017

(65) Prior Publication Data
US 2018/0258279 A1    Sep. 13, 2018

(30) Foreign Application Priority Data

Aug. 31, 2015 (JP) ................................ 2015-170545

(51) Int. Cl.
| | | |
|---|---|---|
| C08K 5/00 | (2006.01) | |
| C08G 59/62 | (2006.01) | |
| C08L 25/14 | (2006.01) | |
| C08L 33/12 | (2006.01) | |
| C08L 65/00 | (2006.01) | |
| C08L 71/10 | (2006.01) | |
| G03F 7/023 | (2006.01) | |
| C08L 101/00 | (2006.01) | |

(52) U.S. Cl.
CPC .............. *C08L 65/00* (2013.01); *C08G 59/62* (2013.01); *C08K 5/00* (2013.01); *C08L 25/14* (2013.01); *C08L 33/12* (2013.01); *C08L 71/10* (2013.01); *C08L 101/00* (2013.01); *G03F 7/023* (2013.01); *G03F 7/0233* (2013.01); *C08L 2205/025* (2013.01); *C08L 2205/03* (2013.01)

(58) Field of Classification Search
CPC .......... C08L 25/14; C08L 33/12; C08L 71/10; C08L 101/00; C08L 2205/025; C08L 2205/03; G03F 7/023; G03F 7/0233
See application file for complete search history.

(56) References Cited

U.S. PATENT DOCUMENTS

| | | | | |
|---|---|---|---|---|
| 6,403,221 B1 * | 6/2002 | Nakamura | ........... | C08G 59/621 257/E23.077 |
| 2011/0007489 A1* | 1/2011 | Ohigashi | ............ | C08G 59/3218 361/783 |
| 2018/0079879 A1* | 3/2018 | Otsuki | ........................ | C08J 3/12 |

FOREIGN PATENT DOCUMENTS

| | | |
|---|---|---|
| JP | 8-283370 A | 10/1996 |
| JP | 10-120753 A | 5/1998 |
| JP | 10-120761 A | 5/1998 |
| JP | 2009-295374 A | 12/2009 |
| JP | 2013-60553 A | 4/2013 |
| WO | 2012/073360 A1 | 6/2012 |
| WO | WO-2016152856 A1 * 9/2016 ................ C08J 3/12 |

OTHER PUBLICATIONS

"Table 60 Periodic Table of the Elements", Grant & Hackh's Chemical Dictionary, Fifth Edition, Grant, et al ed, McGraw-Hill Book Company, New York, NY in USPTO, Oct. 23, 1990, pp. 432-433.*
"phenoxy", pp. 2, obtained from world wide web form Defintion of phenoxy in English Oxford Dictionaries down loaded Aug. 10, 2018.*
International Search Report dated Nov. 1, 2016, issued in counterpart International Application No. PCT/JP2016/074807 (2 pages).
English Translation of International Preliminary Report on Patentability (Chapter I) dated Mar. 6, 2018, issued in PCT/JP2016/074807.

* cited by examiner

*Primary Examiner* — Cynthia Hamilton
(74) *Attorney, Agent, or Firm* — Westerman, Hattori, Daniels & Adrian, LLP

(57) ABSTRACT

A resin composition comprising a binder resin (A), a phenoxy resin having a hydroxyl equivalent of 300 or more, and a cross-linking agent (C). The resin composition of the present invention preferably further comprises a photoacid generator (D). The photoacid generator (D) is more preferably a quinone diazide compound.

11 Claims, No Drawings

RESIN COMPOSITION

TECHNICAL FIELD

The present invention relates to a resin composition and an electronic device having a resin film comprised of that resin composition, more particularly relates to a resin composition able to give a resin film excellent in heat resistance, adhesion to a substrate, solder heat resistance, and thermal shock resistance and an electronic device having a resin film comprised of that resin composition.

BACKGROUND ART

Various display devices such as organic EL devices and liquid crystal display devices, integrated circuit devices, solid state imaging devices, color filters, black matrices, and other electronic devices have various resin films as surface protective films for preventing degradation or damage, flattening films for flattening the device surfaces and interconnects, interlayer insulating films for insulating between interconnects laid out in layers, etc.

In the past, as the resin materials for forming these resin films, thermosetting resin materials such as epoxy resins, polyimides, and polybenzoxazoles have been widely used. In recent years, along with the higher densities of interconnects and devices, in these resin materials as well, development of new resin materials excellent in electrical characteristics such as a low dielectric property has been sought.

To deal with these demands, for example, Patent Document 1 discloses a resin composition containing a cyclic olefin polymer (A) having a protic polar group, a cross-linking agent (B), and a radiation-sensitive compound (C) in which the content of the radiation-sensitive compound (C) is 10 to 45 parts by weight with respect to 100 parts by weight of the cyclic olefin polymer (A). However, according to the radiation-sensitive resin composition described in this Patent Document 1, while it is possible to form a resin film excellent in electrical characteristics such as a low dielectric, property and further excellent in heat resistance, but the adhesion to a substrate, solder heat resistance, and thermal shock resistance are insufficient. Therefore, improvement of these characteristics has been desired.

RELATED ART

Patent Documents

Patent Document 1: Japanese Patent Publication No. 2009-295374A

SUMMARY OF INVENTION

Problem to be Solved by the Invention

The present invention has as its object the provision of a resin composition able to give a resin film excellent in heat resistance, adhesion to a substrate, solder heat resistance, and thermal shock resistance and an electronic device having a resin film comprised of such a resin composition.

Means for Solving the Problem

The inventors engaged in intensive research to achieve the above object and as a result discovered that the above object can be achieved by a resin, composition obtained by mixing a phenoxy resin having a specific amount of hydroxyl group and a cross-linking agent into a binder resin and thereby completed the present invention.

That is, according to the present invention, there are provided:

[1] A resin composition comprising a binder resin (A), a phenoxy resin (B) having an hydroxyl equivalent of 300 or more, and a cross-linking agent (C),

[2] The resin composition according to [1] further comprising a filler in a content of 80 wt % or less with respect to a total solid content forming the resin composition,

[3] The resin composition according to [2] wherein a content of the filler is 0 wt % with respect to a total solid content forming the resin composition,

[4] The resin composition according for any one of [1] to [3] wherein the cross-linking agent (C) is a expound including two or more alkoxymethyl groups or methylol groups in its molecule,

[5] The resin composition according to any one of [1] to [3] wherein, the cross-linking agent (C) is an alicyclic epoxy compound,

[6] The resin composition according to any one of [1] to [3] wherein the cross-linking agent (C) is a compound including two or more alkoxymethyl groups or methylol groups in its molecule and an alicyclic epoxy compound,

[7] The resin composition according to any one of [1] to [6] further comprising a photoacid generator (D),

[8] The resin composition according to any one of [1] to [7] wherein the photoacid generator (D) is a quinone diazide compound,

[9] The resin composition according to any one of [1] to [8] wherein the binder resin (A) is a cyclic olefin polymer having a protic polar group,

[10] The resin composition according to any one of [1] to [9] wherein a ratio of content of the phenoxy resin (B) with respect to a total solid content forming the resin composition is 2 to 75 wt %,

[11] The resin composition according to any one of [1] to [10] wherein the phenoxy resin (B) is a phenoxy resin having a bisphenol structure, and

[12] An electronic device having a resin film comprised of a resin composition according to any one of [1] to [11].

Effects of Invention

According to the present invention, it is possible to provide a resin composition able to give a resin film excellent in heat resistance, adhesion to a substrate, solder heat resistance, and thermal shock resistance and an electronic device having a resin film comprised of such a resin composition.

DESCRIPTION OF EMBODIMENTS

The resin composition of the present invention contains a binder resin (A), a phenoxy resin (B) having a hydroxyl equivalent of 300 or more, and a cross-linking agent (C).

(Binder Resin (A))

The binder resin (A) used in the present invention is not particularly limited, but a cyclic olefin polymer which has a protonic polar group (A1), an acrylic resin (A2), polyimide or its precursor (A3), polybenzoxazole or its precursor (A4), polysiloxane (A5), or phenol resin (A6) is preferable. Among these as well, a cyclic olefin polymer which has a protonic polar group (A1) is particularly preferable.

These binder resins (A) may respectively be used alone or as two types or more combined.

As the cyclic olefin polymer which has a protonic polar group (A1) (below, simply referred to as the "cyclic olefin polymer (A1)"), a polymer of one or more cyclic olefin monomers or a copolymer of one or more cyclic olefin monomers and a monomer which can copolymerize with them may be mentioned, but in the present invention, as the monomer for forming the cyclic olefin polymer (A1), it is preferable to use at least a cyclic olefin monomer which has a protonic polar group (a).

Here, the "protonic polar group" means a group which contains an atom belonging to Group XV or Group XVI of the Periodic Table to which a hydrogen atom directly bonds. Among the atoms belonging to Group XV or Group XVI of the Periodic Table, atoms belonging to Period 1 or Period 2 of Group XV or Group XVI of the Periodic Table are preferable, an oxygen atom, nitrogen atom, or sulfur atom is more preferable, and an oxygen atom is particularly preferable.

As specific examples of such a protonic polar group, a hydroxyl group, carboxy group (hydroxycarbonyl group), sulfonic acid group, phosphoric acid group, and other polar groups which have oxygen atoms; primary amino group, secondary amino group, primary amide group, secondary amide group (imide group), and other polar groups which have nitrogen atoms; a thiol group and other polar groups which have sulfur atoms; etc. may be mentioned. Among these as well, ones which have oxygen atoms are preferable, carboxy group is more preferable.

In the present invention, the number of protonic polar groups which bond with the cyclic olefin resin which has protonic polar groups is not particularly limited. Further, different types of protonic polar groups may also be included.

As specific examples of the cyclic olefin monomer which has a protonic polar group (a) (below, suitably called the "monomer (a)"), a carboxy group-containing cyclic olefin such as 2-hydroxycarbonylbicyclo[2.2.1]hept-5-ene, 2-methyl-2-hydroxycarbonylbicyclo[2.2.1]hept-5-ene, 2-carboxymethyl-2-hydroxycarbonylbicyclo[2.2.1]hept-5-ene, 2-hydroxycarbonyl-2-methoxycarbonylmethylbicyclo[2.2.1]hept-5-ene, 2-hydroxycarbonyl-2-ethoxycarbonylmethylbicyclo[2.2.1]hept-5-ene, 2-hydxoxycarbonyl-2-propoxycarbonylmethylbicyclo[2.2.1]hept-5-ene, 2-hydroxycarbonyl-2-butoxycarbonylmethylbicyclo[2.2.1]hept-5-ene, 2-hydroxycarbonyl-2-pentyloxycarbonylmethylbicyclo[2.2.1]hept-5-ene, 2-hydroxycarbonyl-2-hexyloxycarbonylmethylbicyclo[2.2.1]hept-5-ene, 2-hydroxycarbonyl-2-cyclohexyloxycarbonylmethylbicyclo[2.2.1]hept-5-ene, 2-hydroxycarbonyl-2-phenoxycarbonylmethylbicyclo[2.2.1]hept-5-ene, 2-hydroxycarbonyl-2-naphthyloxycarbonylmethylbicyclo[2.2.1]hept-5-ene, 2-hydroxycarbonyl-2-biphenyloxycarbonylmethylbicyclo[2.2.1]hept-5-ene, 2-hydroxycarbonyl-2-benzyloxycarbonylmethylbicyclo[2.2.1]hept-5-ene, 2-hydroxycarbonyl-2-hydroxyethoxycarbonylmethylbicyclo[2.2.1]hept-5-ene, 2,3-dihydroxycarbonylbicyclo[2.2.1]hept-5-ene, 2-hydroxycarbonyl-3-methoxycarbonylbicyclo[2.2.1]hept-5-ene, 2-hydroxycarbonyl-3-ethoxycarbonylbicyclo[2.2.1]hept-5-ene, 2-hydroxycarbonyl-3-propoxycarbonylbicyclo[2.2.1]hept-5-ene, 2-hydroxycarbonyl-3-butoxycarbonylbicyclo[2.2.1]hept-5-ene, 2-hydroxycarbonyl-3-pentyloxycarbonylbicyclo[2.2.1]hept-5-ene, 2-hydroxycarbonyl-3-hexyloxycarbonylbicyclo[2.2.1]hept-5-ene, 2-hydroxycarbonyl-3-cyclohexyloxycarbonylbicyclo[2.2.1]hept-5-ene, 2-hydroxycarbonyl-3-phenoxycarbonylbicyclo[2.2.1]hept-5-ene, 2-hydroxycarbonyl-3-naphthyloxycarbonylbicyclo[2.2.1]hept-5-ene, 2-hydroxycarbonyl-3-biphenyloxycarbonylbicyclo[2.2.1]hept-5-ene, 2-hydroxycarbonyl-3-benzyloxycarbonylbicyclo[2.2.1]hept-5-ene, 2-hydroxycarbonyl-3-hydroxyethoxycarbonylbicyclo[2.2.1]hept-5-ene, 2-hydroxycarbonyl-3-hydroxycarbonylmethylbicyclo[2.2.1]hept-5-ene, 3-methyl-2-hydroxycarbonylbicyclo[2.2.1]hept-5-ene, 3-hydroxymethyl-2-hydroxycarbonylbicyclo[2.2.1]hept-5-ene, 2-hydroxycarbonyltricyclo[5.2.1.0$^{2,6}$]deca-3,8-diene, 4-hydroxycarbonyltetracyclo[6.2.1.1$^{3,6}$.0$^{2,7}$]dodec-9-ene, 4-methyl-4-hydroxycarbonyltetracyclo[6.2.1.1$^{3,6}$.0$^{2,7}$]dodec-9-ene, 4,5-dihydroxycarbonyltetracyclo[6.2.1.1$^{3,6}$.0$^{2,7}$]dodec-9-ene, 4-carboxymethyl-4-hydroxycarbonyltetracyclo[6.2.1.1$^{3,6}$.0$^{2,7}$]dodec-9-ene, N-(hydroxycarbonylmethyl)bicyclo[2.2.1]hept-5-ene-2,3-dicarboxyimide, N-(hydroxycarbonylethyl)bicyclo[2.2.1]hept-5-ene-2,3-dicarboxyimide, N-(hydroxycarbonylpentyl)bicyclo[2.2.1]hept-5-ene-2,3-dicarboxyimide, N-(dihydroxycarbonylethyl)bicyclo[2.2.1]hept-5-ene-2,3-dicarboxyimide, N-(dihydroxycarbonylpropyl)bicyclo[2.2.1]hept-5-ene-2,3-dicarboxyimide, N-(hydroxycarbonylphenethyl)bicyclo[2.2.1]hept-5-ene-2,3-dicarboxyimide, N-(2-(4-hydroxyphenyl)-1-(hydroxycarbonyl)ethyl)bicyclo[2.2.1]hept-5-ene-2,3-dicarboxyimide, and N-(hydroxycarbonylphenyl)bicyclo[2.2.1]hept-5-ene-2,3-dicarboxyimide; a hydroxyl group-containing cyclic olefin such as 2-(4-hydroxyphenyl)bicyclo[2.2.1]hept-5-ene, 2-methyl-2-(4-hydroxyphenyl)bicyclo[2.2.1]hept-5-ene, 4-(4-hydroxyphenyl)tetracyclo[6.2.1.1$^{3,6}$.0$^{2,7}$]dodec-9-ene, 4-methyl-4-(4-hydroxyphenyl)tetracyclo[6.2.1.1$^{3,6}$.0$^{2,7}$]dodec-9-ene, 2-hydroxybicyclo[2.2.1]hept-5-ene, 2-hydroxymethylbicyclo[2.2.1]hept-5-ene, 2-hydroxyethylbicyclo[2.2.1]hept-5-ene, 2-methyl-2-hydroxymethylbicyclo[2.2.1]hept-5-ene, 2,3-dihydroxymethylbicyclo[2.2.1]hept-5-ene, 2-(hydroxyethoxycarbonyl)bicyclo[2.2.1]hept-5-ene, 2-methyl-2-(hydroxyethoxycarbonyl)bicyclo[2.2.1]hept-5-ene, 2-(1-hydroxy-1-trifluoromethyl-2,2,2-trifluoroethyl)bicyclo[2.2.1]hept-5-ene, 2-(2-hydroxy-2-trifluoromethyl-3,3,3-trifluoropropyl)bicyclo[2.2.1]hept-5-ene, 3-hydroxytricyclo[5.2.1.0$^{2,6}$]deca-4,8-diene, 3-hydroxymethyltricyclo[5.2.1.0$^{2,6}$]deca-4,8-diene, 4-hydroxytetracyclo[6.2.1.1$^{3,6}$.0$^{2,7}$]dodec-9-ene, 4-hydroxymethyltetracyclo[6.2.1.1$^{3,6}$.0$^{2,7}$]dodec-9-ene, 4,5-dihydroxymethyltetracyclo[6.2.1.1$^{3,6}$.0$^{2,7}$]dodec-9-ene, 4-(hydroxyethoxycarbonyl)tetracyclo[6.2.1.1$^{3,6}$.0$^{2,7}$]dodec-9-ene, 4-methyl-4-(hydroxyethoxycarbonyl)tetracyclo[6.2.1.1$^{3,6}$.0$^{2,7}$]dodec-9-ene, N-(hydroxyethyl)bicyclo[2.2.1]hept-5-ene-2,3-dicarboxyimide, and N-(hydroxyphenyl)bicyclo[2.2.1]hept-5-ene-2,3-dicarboxyimide etc. may be mentioned. Among these as well, from the viewpoint of the adhesion of the obtained resin film becoming higher, carboxy group-containing cyclic olefins are preferable, while 4-hydroxycarbonyltetracyclo[6.2.1.1$^{3,6}$.0$^{2,7}$]dodec-9-ene is particularly preferable. These monomers (a) may respectively be used alone or may be used as two types or more combined.

In the cyclic olefin polymer (A1), the ratio of content of the units of the monomer (a) is preferably 10 to 90 mol % with respect to all monomer units, more preferably 20 to 80 mol %, still more preferably 30 to 70 mol %. By making the ratio of content of the units of the monomer (a) the above range, it is possible to further improve the heat-resistance of the obtained resin film while making the cyclic olefin polymer (A1) good in solubility in a polar solvent.

Further, the cyclic olefin polymer (A1) used in the present invention may be a copolymer which is obtained by copolymerization of a cyclic olefin monomer which has a protonic polar group (a) and a monomer (b) which can copolymerize with this. As such a copolymerizable monomer, a cyclic olefin monomer which has a polar group other than a protonic polar group (b1), a cyclic olefin monomer which does not have a polar group (b2), and a monomer other than a cyclic olefin (b3) (below, suitably called the "monomer (b1)", "monomer (b2)", and "monomer (b3)") may be mentioned.

As the cyclic olefin monomer which has a polar group other than a protonic polar group (b1), for example, a cyclic olefin which has an N-substituted imide group, ester group, cyano group, acid anhydride group, or halogen atom may be mentioned.

As a cyclic olefin which has an N-substituted imide group, for example, a monomer represented by the following formula (1) may be mentioned.

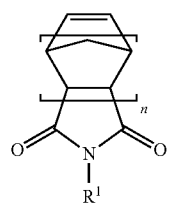

(1)

In the above formula (1), $R^1$ indicates a hydrogen atom or alkyl group or aryl group having 1 to 16 carbon atoms. "n" indicates an integer of 1 to 2.)

In the above formula (1), $R^1$ is an alkyl group or aryl group having 1 to 16 carbon atoms. As specific examples of the alkyl group, a methyl group, ethyl group, n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl groups, n-hexadecyl group, and other straight chain alkyl groups; cyclopropyl group, cyclobutyl groups, cyclopentyl group, cyclohexyl group, cycloheptyl group, cyclooctyl group, cyclononyl group, cyclodecyl group, cycloundecyl group, cyclododecyl group, norbornyl group, bornyl group, isobornyl group, decahydronaphthyl group, tricyclodecanyl group, adamantyl group, and other cyclic alkyl groups; 2-propyl group, 2-butyl group, 2-methyl-1-propyl group, 2-methyl-2-propyl group, 1-methylbutyl group, 2-methylbutyl group, 1-methylpentyl group, 1-ethylbutyl group, 2-methylhexyl group, 2-ethylhexyl group, 4-methylheptyl group, 1-methylnonyl group, 1-methyltridecyl group, 1-methyltetradecyl group, and other branched alkyl groups; etc. may be mentioned. Further, as specific examples of the aryl group, a phenyl group, benzyl group etc. may be mentioned. Among these as well, due to the more excellent heat resistance and solubility in a polar solvent, an alkyl group and aryl group having 1 to 14 carbon atoms are preferable, while an alkyl group and aryl group having 6 to 10 carbon atoms are more preferable. If the number of carbon atoms is 4 or less, the solubility in a polar solvent is inferior, while if the number of carbon atoms is 17 or more, the heat resistance is inferior. Further, when patterning the resin film, there is the problem that the resin film melts by heat and the patterns to end up disappearing.

As specific examples of the monomer represented by the above, general formula (1), bicyclo[2.2.1]hept-5-ene-2,3-dicarboxyimide, N-phenyl-bicyclo[2.2.1]hept-5-ene-2,3-dicarboxyimide, N-methylbicyclo[2.2.1]hept-5-ene-2,3-dicarboxyimide, N-ethylbicyclo[2.2.1]hept-5-ene-2,3-dicarboxyimide, N-propylbicyclo[2.2.1]hept-5-ene-2,3-dicarboxyimide, N-butylbicyclo[2.2.1]hept-5-ene-2,3-dicarboxyimide, N-cyclohexylbicyclo[2.2.1]hept-5-ene-2,3-dicarboxyimide, N-adamantylbicyclo[2.2.1]hept-5-ene-2,3-dicarboxyimide, N-(1-methylbutyl)bicyclo[2.2.1]hept-5-ene-2,3-dicarboxyimide, N-(2-methylbutyl)bicyclo[2.2.1]hept-5-ene-2,3-dicarboxyimide, N-(1-methylpentyl)bicyclo[2.2.1]hept-5-ene-2,3-dicarboxyimide, N-(2-methylpentyl)bicyclo[2.2.1]hept-5-ene-2,3-dicarboxyimide, N-(1-ethylbutyl)bicyclo[2.2.1]hept-5-ene-2,3-dicarboxyimide, N-(2-ethylbutyl)bicyclo[2.2.1]hept-5-ene-2,3-dicarboxyimide, N-(1-methylhexyl)bicyclo[2.2.1]hept-5-ene-2,3-dicarboxyimide, N-(2-methylhexyl)bicyclo[2.2.1]hept-5-ene-2,3-dicarboxyimide, N-(3-methylhexyl)bicyclo[2.2.1]hept-5-ene-2,3-dicarboxyimide, N-(1-butylpentyl)bicyclo[2.2.1]hept-5-ene-2,3-dicarboxyimide, N-(2-butylpentyl)bicyclo[2.2.1]hept-5-ene-2,3-dicarboxyimide, N-(1-methylheptyl)bicyclo[2.2.1]hept-5-ene-2,3-dicarboxyimide, N-(2-methylheptyl)bicyclo[2.2.1]hept-5-ene-2,3-dicarboxyimide, N-(3-methylheptyl)bicyclo[2.2.1]hept-5-ene-2,3-dicarboxyimide, N-(4-methylheptyl)bicyclo[2.2.1]hept-5-ene-2,3-dicarboxyimide, N-(1-ethylhexyl)bicyclo[2.2.1]hept-5-ene-2,3-dicarboxyimide, N-(2-ethylhexyl)bicyclo[2.2.1]hept-5-ene-2,3-dicarboxyimide, N-(3-ethylhexyl)bicyclo[2.2.1]hept-5-ene-2,3-dicarboxyimide, N-(1-propylpentyl)bicyclo[2.2.1]hept-5-ene-2,3-dicarboxyimide, N-(2-propylpentyl)bicyclo[2.2.1]hept-5-ene-2,3-dicarboxyimide, N-(1-methyloctyl)bicyclo[2.2.1]hept-5-ene-2,3-dicarboxyimide, N-(2-methyloctyl)bicyclo[2.2.1]hept-5-ene-2,3-dicarboxyimide, N-(3-methyloctyl)bicyclo[2.2.1]hept-5-ene-2,3-dicarboxyimide, N-(4-methyloctyl)bicyclo[2.2.1]hept-5-ene-2,3-dicarboxyimide, N-(1-ethylheptyl)-bicyclo[2.2.1]hept-5-ene-2,3-dicarboxyimide, N-(2-ethylheptyl)-bicyclo[2.2.1]hept-5-ene-2,3-dicarboxyimide, N-(3-ethylheptyl)bicyclo[2.2.1]hept-5-ene-2,3-dicarboxyimide, N-(4-ethylheptyl)bicyclo[2.2.1]hept-5-ene-2,3-dicarboxyimide, N-(1-propylhexyl)bicyclo[2.2.1]hept-5-ene-2,3-dicarboxyimide, N-(2-propylhexyl)bicyclo[2.2.1]hept-5-ene-2,3-dicarboxyimide, N-(3-propylhexyl)bicyclo[2.2.1]hept-5-ene-2,3-dicarboxyimide, N-(1-methylnonyl)bicyclo[2.2.1]hept-5-ene-2,3-dicarboxyimide, N-(2-methylnonyl)bicyclo[2.2.1]hept-5-ene-2,3-dicarboxyimide, N-(3-methylnonyl)bicyclo[2.2.1]hept-5-ene-2,3-dicarboxyimide, N-(4-methylnonyl)bicyclo[2.2.1]hept-5-ene-2,3-dicarboxyimide, N-(5-methylnonyl)bicyclo[2.2.1]hept-5-ene-2,3-dicarboxyimide, N-(1-ethyloctyl)bicyclo[2.2.1]hept-5-ene-2,3-dicarboxyimide, N-(2-ethyloctyl)bicyclo[2.2.1]hept-5-ene-2,3-dicarboxyimide, N-(3-ethyloctyl)bicyclo[2.2.1]hept-5-ene-2,3-dicarboxyimide, M-(4-ethyloctyl)bicyclo[2.2.1]hept-5-ene-2,3-dicarboxyimide, N-(1-methyldecyl)bicyclo[2.2.1]hept-5-ene-2,3-dicarboxyimide, N-(1-methyldodecyl)bicyclo[2.2.1]hept-5-ene-2,3-dicarboxyimide, N-(1-methylundecyl)bicyclo[2.2.1]hept-5-ene-2,3-dicarboxyimide, N-(1-methyldodecyl)bicyclo[2.2.1]hept-5-ene-2,3-dicarboxyimide, N-(1-methyltridecyl)bicyclo[2.2.1]hept-5-ene-2,3-dicarboxyimide, N-(1-methyltetradecyl)bicyclo[2.2.1]hept-5-ene-2,3-dicarboxyimide, N-(1-methylpentadecyl)bicyclo[2.2.1]hept-5-ene-2,3-dicarboxyimide, N-phenyltetracyclo[6.2.1.1$^{3,6}$.0$^{2,7}$]dodec-9-ene-4,5-dicarboxyimide, N-(2,4-dimethoxyphenyl)-tetracyclo[6.2.1.1$^{3,6}$.0$^{2,7}$]dodec-9-ene-4,5-dicarboxyimide, etc. may be mentioned. Note that, these may respectively be used alone or may be used as two types or more combined.

Note that, the monomer represented by the above general formula (1) can, for example, be obtained by an imidization reaction between a corresponding amine and 5-norbornene-2,3-dicarboxylic acid anhydride. Further, the obtained monomer can be efficiently isolated by separating and refining the reaction solution of the imidization reaction by a known method.

As the cyclic olefin which has an ester group, for example, 2-acetoxybicyclo[2.2.1]hept-5-ene, 2-acetoxymethylbicyclo[2.2.1]hept-5-ene, 2-methoxycarbonylbicyclo[2.2.1]hept-5-ene, 2-ethoxycarbonylbicyclo[2.2.1]hept-5-ene, 2-propoxycarbonylbicyclo[2.2.1]hept-5-ene, 2-butoxycarbonylbicyclo[2.2.1]hept-5-ene, 2-cyclohexyloxycarbonylbicyclo[2.2.1]hept-5-ene, 2-methyl-2-methoxycarbonylbicyclo[2.2.1]hept-5-ene, 2-methyl-2-ethoxycarbonylbicyclo[2.2.1]hept-5-ene, 2-methyl-2-propoxycarbonylbicyclo[2.2.1]hept-5-ene, 2-methyl-2-butoxycarbonylbicyclo[2.2.1]hept-5-ene, 2-methyl-2-cyclohexyloxycarbonylbicyclo[2.2.1]hept-5-ene, 2-(2,2,2-trifluoroethoxycarbonyl)bicyclo[2.2.1]hept-5-ene, 2-methyl-2-(2,2,2-trifluoroethoxycarbonyl)bicyclo[2.2.1]hept-5-ene, 2-methoxycarbonyltricyclo[5.2.1.0$^{2,6}$]dec-8-ene, 2-ethoxycarbonyltricyclo [5.2.1.0$^{2,6}$]dec-8-ene, 2-propoxycarbonyltricyclo[5.2.1.0$^{2,6}$]dec-8-ene, 4-acetoxytetracyclo[6.2.1.1$^{3,6}$.0$^{2,7}$]dodec-9-ene, 4-methoxycarbonyltetracyclo[6.2.1.1$^{3,6}$.0$^{2,7}$]dodec-9-ene, 4-ethoxycarbonyltetracyclo[6.2.1.1$^{3,6}$.0$^{2,7}$]dodec-9-ene, 4-propoxycarbonyltetracyclo[6.2.1.1$^{3,6}$.0$^{2,7}$]dodec-9-ene, 4-butoxycarbonyltetracyclo[6.2.1.1$^{3,6}$.0$^{2,7}$]dodec-9-ene, 4-methyl-4-methoxycarbonyltetracyclo[6.2.1.1$^{3,6}$.0$^{2,7}$]dodec-9-ene, 4-methyl-4-ethoxycarbonyltetracyclo [6.2.1.1$^{3,6}$.0$^{2,7}$]dodec-9-ene, 4-methyl-4-propoxycarbonyltetracyclo[6.2.1.1$^{3,6}$.0$^{2,7}$]dodec-9-ene, 4-methyl-4-butoxycarbonyltetracyclo[6.2.1.1$^{3,6}$.0$^{2,7]}$dodec-9-ene, 4-(2,2,2-trifluoroethoxycarbonyl)tetracyclo[6.2.1.1$^{3,6}$.0$^{2,7}$]dodec-9-ene, 4-methyl-4-(2,2,2-trifluoroethoxycarbonyl)tetracyclo [6.2.1.1$^{3,6}$.0$^{2,7}$]dodec-9-ene, etc. may be mentioned.

As the cyclic olefin which has a cyano group, for example, 4-cyanotetracyclo[6.2.1.1$^{3,6}$.0$^{2,7}$]dodec-9-ene, 4-methyl-4-cyanotetracyclo[6.2.1.1$^{3,6}$.0$^{2,7}$]dodec-9-ene, 4,5-dicyanotetracyclo[6.2.1.1$^{3,6}$.0$^{2,7}$]dodec-9-ene, 2-cyanobicyclo[2.2.1]hept-5-ene, 2-methyl-2-cyanobicyclo[2.2.1]hept-5-ene, 2,3-dicyanobicyclo[2.2.1]hept-5-ene, etc. may be mentioned.

As the cyclic olefin which has an acid anhydride group, for example, tetracyclo[6.2.1.1$^{3,6}$.0$^{2,7}$]dodec-3-ene-4,5-dicarboxylic anhydride, bicyclo[2.2.1]hept-5-ene-2,3-dicarboxylic anhydride, 2-carboxymethyl-2-hydroxycarbonylbicyclo[2.2.1]hept-5-ene anhydride, etc. may be mentioned.

As the cyclic olefin which has a halogen atom, for example, 2-chlorobicyclo[2.2.1]hept-5-ene, 2-chloromethylbicyclo[2.2.1]hept-5-ene, 2-(chlorophenyl)bicyclo[2.2.1]hept-5-ene, 4-chlorotetracyclo[6.2.1.1$^{3,6}$.0$^{2,7]}$dodec-9-ene, 4-methyl-4-chlorotetracyclo[6.2.1.1$^{3,6}$.0$^{2,7}$]dodec-9-ene, etc. may be mentioned.

These monomers (b1) may respectively be used alone or may be used as two types or more combined.

As the cyclic olefin monomer which does not have a polar group (b2), bicyclo[2.2.1]hept-2-ene (also called "norbornene"), 5-ethylbicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[5.2.1.0$^{2,6}$]deca-3,8-diene (common name: dicyclopentadiene), tetracyclo[10.2.1.0$^{2,11}$.0$^{4,9}$]pentadec-4,6,8,13-tetraene, tetracyclo[6.2.1.1$^{3,6}$.0$^{2,7}$]dodec-4-ene (also called "tetracyclododecene"), 9-methyl-tetracyclo[6.2.1.1$^{3,6}$.0$^{2,7}$]dodec-4-ene, 9-ethyl-tetracyclo[6.2.1.1$^{3,6}$.0$^{2,7}$]dodec-4-ene, 9-methylidene-tetracyclo[6.2.1.1$^{3,6}$.0$^{2,7}$]dodec-4-ene, 9-ethylidene-tetracyclo[6.2.1.1$^{3,6}$.0$^{2,7}$]dodec-4-ene, 9-vinyl-tetracyclo[6.2.1.1$^{3,6}$.0$^{2,7}$]dodec-4-ene, 9-propenyl-tetracyclo[6.2.1.1$^{3,6}$.0$^{2,7}$]dodec-4-ene, pentacyclo [9.2.1.1$^{3,9}$.0$^{2,10}$.0$^{4,8}$]pentadeca-5,12-diene, cyclobutene, cyclopentene, cyclopentadiene, cyclohexene, cycloheptene, cyclooctene, cyclooctadiene, indene, 3a,5,6,7a-tetrahydro-4,7-methano-1H-indene, 9-phenyl-tetracyclo[6.2.1.1$^{3,6}$.0$^{2,7}$]dodec-4-ene, tetracyclo[9.2.1.0$^{2,10}$.0$^{3,8}$]tetradec-3,5,7,12-tetraene, pentacyclo[9.2.1.1$^{3,9}$.0$^{2,10}$.0$^{4,8}$]pentadec-12-ene, etc. may be mentioned.

These monomers (b2) may respectively be used alone or may be used as two types or more combined.

As specific examples of the monomer other than a cyclic olefin (b3), ethylene; propylene, 1-butene, 1-pentene, 1-hexene, 3-methyl-1-butene, 3-methyl-1-pentene, 3-ethyl-1-pentene, 4-ethyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-actadecene, 1-eicosene, and other $C_2$ to $C_{20}$ α-olefins; 4-hexadiene, 1,5-hexadiene, 4-methyl-1,4-hexadiene, 5-methyl-1,4-hexadiene, 1,7-octadiene, and other nonconjugated dienes and their derivatives; etc. may be mentioned. Among these as well, α-olefin is preferable.

These monomers (b3) may respectively be used alone or may be used as two types or more combined.

Among these monomers (b1) to (b3) as well, from the viewpoint of the effect of the present invention becoming more remarkable, a cyclic olefin monomer which has a polar group other than a protonic polar group (b1) is preferable, while a cyclic olefin which has an N-substituted imide group is particularly preferable.

In the cyclic olefin polymer (A1), the ratio of content of units of the copolymerizable monomer (b) is preferably 10 to 90 mol % with respect to the total monomer units, more preferably 20 to 80 mol %, still more preferably 30 to 70 mol %. By making the ratio of content of the units of the monomer (b) the above range, it is possible to further improve the heat resistance of the obtained resin film while making the cyclic olefin polymer (A1) good in solubility in a polar solvent.

Note that, in the present invention, it is also possible to introduce a protonic group in a cyclic olefin-based polymer which does not have a protonic polar group utilizing a known modifying agent so as to obtain the cyclic olefin polymer (A1).

The polymer which does not have a protonic polar group can be obtained by polymerizing at least one of the above-mentioned monomers (b1) and (b2) and, in accordance with need, a monomer (b3) in any combination.

As a modifying agent, for introduction of a protonic polar group, usually a compound which has a protonic polar group and a reactive carbon-carbon unsaturated bond in a single molecule is used.

As specific examples of this compound, acrylic acid, methacrylic acid, angelic acid, tiglic acid, oleic acid, elaidic acid, erucic acid, brassidic acid, maleic acid, fumaric acid, citraconic acid, mesaconic acid, itaconic acid, atropic acid, cinnamic acid, or other unsaturated carboxylic acid; allyl alcohol, methylvinyl methanol, crotyl alcohol, methacryl alcohol, 1-phenylethen-1-ol, 2-propen-1-ol, 3-buten-1-ol, 3-buten-2-ol, 3-methyl-3-buten-1-ol, 3-methyl-2-buten-1-ol, 2-methyl-3-buten-2-ol, 2-methyl-3-buten-1-ol, 4-penten-1-ol, 4-methyl-4-penten-1-ol, 2-hexen-1-ol, or other unsaturated alcohol; etc. may be mentioned.

The modification reaction of a polymer in Which these modifying agents are used may be performed in accordance with an ordinary method and is usually performed in the presence of a radical generator.

Note that, the cyclic olefin polymer (A1) used in the present invention may be a ring-opened polymer obtained by ring-opening polymerization of the above-mentioned monomers or may be an addition polymer obtained, by addition polymerization of the above-mentioned monomers, but from the viewpoint of the effect of the present invention becoming more remarkable, a ring-opened polymer is preferable.

A ring-opened polymer can be produced by ring-opening methathesis polymerization of a cyclic olefin monomer which has a protonic polar group (a) and a copolymerizable monomer (b) used according to need in the presence of a methathesis reaction catalyst. As the method of production, for example, the method described in International Publication No. 2010/110323A, [0039] to [0079], etc. can be used.

Further, when the cyclic olefin polymer (A1) used in the present invention is a ring-opened polymer, it is preferable to further perform a hydrogenation reaction and obtain a hydrogenated product in which the carbon-carton double bonds which are contained in the main chain are hydrogenated. When the cyclic olefin polymer (A1) is a hydrogenated product, the ratio of the hydrogenated carbon-carbon double bonds (hydrogenation rate) is usually 50% or more. From the viewpoint of the heat resistance, 70% or more is preferable, 90% or more is more preferable, and 95% or more is furthermore preferable.

Further, the acrylic resin (A2) used in the present invention is not particularly limited, but a homopolymer or copolymer having at least one of a carboxylic acid which has an acryl group, carboxylic anhydride which has an acryl group, epoxy group-containing acrylate compound and oxetane group-containing acrylate compound as an essential ingredient is preferable.

As specific examples of the carboxylic acid which has an acryl group, (meth)acrylic acid (meaning acrylic acid and/or methacrylic acid, below, same for methyl(meth)acrylate etc.), crotonic acid, maleic acid, fumaric acid, citraconic acid, mesaconic acid, glutaconic acid, phthalic acid mono-(2-((meth)acryloyloxy)ethyl), N-(carboxyphenyl)maleimide, N-(carboxyphenyl)(meth)acrylamide, etc. may be mentioned.

As specific examples of the carboxylic anhydride which has an acryl group, maleic anhydride, citraconic anhydride, etc. may be mentioned.

As specific examples of the epoxy group-containing acrylate compound, glycidyl acrylate, glycidyl methacrylate, glycidyl α-ethyl acrylate, glycidyl α-n-propyl acrylate, glycidyl α-n-butyl acrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethyl acrylate, 3,4-epoxycyclohexylmethyl acrylate, 3,4-epoxycyclohexylmethyl methacrylate, etc. may be mentioned.

As specific examples of the oxetane group-containing acrylate compound, (3-methyloxetan-3-yl)methyl (meth)acrylate, (3-ethyloxetan-3-yl)methyl(meth)acrylate, (3-methyloxetan-3-yl)ethyl (meth)acrylate, (3-ethyloxetan-3-yl)ethyl (meth)acrylate, (3-chloromethyloxetan-3-yl)methyl (meth)acrylate, (oxetan-2-yl)methyl (meth)acrylate, (2-methyloxetan-2-yl)methyl(meth)acrylate, (2-ethyloxetan-2-yl)methyl (meth)acrylate, (1-methyl-1-oxetanyl-2-phenyl)-3-(meth)acrylate, (1-methyl-1-oxetanyl)-2-trifluoromethyl-3-(meth)acrylate, and (1-methyl-1-oxetanyl)-4-trifluoromethyl-2-(meth)acrylate, etc. may be mentioned.

Among these as well, (meth)acrylic acid, maleic anhydride, glycidyl (meth)acrylate, 6,7-epoxyheptyl methacrylate, etc. are preferable.

The acrylic resin (A2) may also be a copolymer of at least one compound which is selected from unsaturated carboxylic acids, unsaturated carboxylic anhydrides, and epoxy group-containing unsaturated compounds, and other acrylate-based monomers or copolymerizable monomers other than acrylates.

As other acrylate-based monomers, methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, amyl (meth)acrylate, isoamyl (meth)acrylate, hexyl (meth)acrylate, heptyl (meth)acrylate, octyl (meth)acrylate, isooctyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, and other alkyl (meth)acrylates; hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, and other hydroxyalkyl (meth)acrylates; phenoxyethyl (meth)acrylate, 2-hydroxy-3-phenoxypropyl (meth)acrylate, and other phenoxyalkyl (meth)acrylates; 2-methoxyethyl (meth)acrylate, 2-ethoxyethyl (meth)acrylate, 2-propoxyethyl (meth)acrylate, 2-butoxyethyl (meth)acrylate, 2-methoxybutyl (meth)acrylate, and other alkoxyalkyl (meth)acrylates; polyethylene glycol mono(meth)acrylate, ethoxydiethylene glycol (meth)acrylate, methoxypolyethylene glycol (meth)acrylate, phenoxypolyethylene glycol (meth)acrylate, nonyl phenoxypolyethylene glycol (meth)acrylate, polypropylene glycol mono (meth)acrylate, methoxypolypropylene glycol (meth)acrylate, ethoxypolypropylene glycol (meth)acrylate, nonylphenoxypolypropylene glycol (meth)acrylate, and other polyalkylene glycol (meth)acrylates; cyclohexyl (meth)acrylate, 2-methylcyclohexyl (meth)acrylate, 4-butylcyclohexyl (meth)acrylate, 1-adamantyl (meth)acrylate, 2-methyl-2-adamantyl (meth)acrylate, 2-ethyl-2-admantyl (meth)acrylate, tricyclo[5.2.1.0$^{2,6}$]decan-8-yl (meth)acrylate, tricyclo [5.2.1.0$^{2,6}$]-3-decen-8-yl (meth)acrylate, tricyclo[5.2.1.0$^{2,6}$]-3-decen-9-yl (meth)acrylate, bornyl (meth)acrylate, isobornyl (meth)acrylate, and other cycloalkyl (meth)acrylates; phenyl (meth)acrylate, naphthyl (meth)acrylate, biphenyl (meth)acrylate, benzyl (meth)acrylate, tetrahydrofurfuryl (meth)acrylate, 5-tetrahydrofurfuryl oxycarbonylpentyl (meth)acrylate, vinyl (meth)acrylate, allyl (meth)acrylate, 2-(2-vinyloxyethoxy)ethyl (meth)acrylate, 2-[tricyclo[5.2.1.0$^{2,6}$]decan-8-yloxy]ethyl (meth)acrylate, 2-[tricyclo[5.2.1.0$^{2,6}$]-3-decen-8-yloxy]ethyl (meth)acrylate, 2-[tricyclo[5.2.1.0$^{2,6}$]-3-decen-9-yloxy]ethyl (meth)acrylate, γ-butyrolactone (meth)acrylate, maleimide, N-methylmaleimide, N-ethylmaleimide, N-butylmaleimide, N-cyclohexylmaleimide, N-benzylmaleimide, N-phenylmaleimide, N-(2,6-diethylphenyl)maleimide, N-(4-acetylphenyl)maleimide, N-(4-hydroxyphenyl)maleimide, N-(4-acetoxyphenyl)maleimide, N-(4-dimethylamino-3,5-dinitrophenyl)maleimide, N-(1-anilinonaphthyl-4)maleimide, N-[4-(2-benzooxazolyl)phenyl]maleimide, N-(9-acridinyl)maleimide, etc. may be mentioned.

Among these as well, methyl (meth)acrylate, butyl (meth)acrylate, cyclohexyl (meth)acrylate, 2-methylcyclohexyl (meth)acrylate, benzyl (meth)acrylate, tricyclo[5.2.1.0$^{2,6}$]decan-8-yl (meth)acrylate, N-phenylmaleimide, N-cyclohexylmaleimide, etc. are preferable.

The copolymerizable monomer other than acrylate is not particularly limited so long as a compound which can copolymerize with the above carboxylic acid which has an acryl group, carboxylic anhydride which has an acryl group, epoxy group-containing acrylate compound, but, for example, vinylbenzylmethyl ether, vinylglycidyl ether, styrene, α-methylstyrene, vinyltoluene, indene, vinylnaphthalene, vinylbiphenyl, chlorostyrene, bromostyrene, chloromethylstyrene, p-tert-butoxystyrene, p-hydroxystyrene, p-hydroxy-α-methylstyrene, p-acetoxystyrene, p-carboxystyrene, 4-hydroxyphenylvinylketone, acrylonitrile, methacrylonitrile, (meth)acrylamide, 1,2-epoxy-4-vinylcyclohexane, isobutene, norbornene, butadiene, isoprene, and other radical polymerizable compounds may be mentioned.

These compounds may respectively be used alone or may be used as two types or more combined.

The polymerization method of the above monomer may be an ordinary method. For example, the suspension polymerization method, the emulsion polymerization method, the solution peptization method, etc. may be employed.

The polyimide or its precursor (A3) used in the present invention is obtained by reacting a tetracarboxylic dianhydride and diamine, and it may be one obtained by further heat treating the result, if necessary. As the precursor for obtaining the polyimide, a polyamic acid, polyamic acid ester, polyisoimide, polyamic acid sulfonamide, etc. may be mentioned.

The polyimide or its precursor (A3) used in the present invention is synthesized by a known method. That is, it is synthesized by a known method such as selectively combining tetracarboxylic dianhydride and a diamine and reacting these in N-methyl-2-pyrrolidone, N,N-dimethylacetoamide, N,N-dimethylformamide, dimethylsulfoxide, hexamethylphosphoric triamide, γ-butyrolactone, cyclopentanone, or other polar solvent.

When excessively using a diamine for polymerization, it is possible to make a carboxylic anhydride react with the end amino group of the produced polyimide (A3) so as to protect the end amino group. Further, when excessively using tetracarboxylic dianhydride for polymerization, it is possible to make an amine compound react with the end acid anhydride group of the produced polyimide (A3) so as to protect the end acid anhydride group.

As examples of such carboxylic anhydrides, phthalic anhydride, trimellitic anhydride, maleic anhydride, naphthalic anhydride, hydrogenated phthalic anhydride, methyl-5-norbornene-2,3-dicarboxylic anhydride, itaconic anhydride, tetrahydrophthalic acid anhydride, etc. may be mentioned, while as examples of amine compounds, aniline, 2-hydroxyaniline, 3-hydroxyaniline, 4-hydroxyaniline, 2-ethynylaniline, 3-ethynylaniline, 4-ethynylaniline, etc. may be mentioned.

The polybenzoxazole or its precursor (A4) used in the present, invention is obtained by reacting a bis(ortho-aminophenol) compound, and a dicarboxylic acid, dicarboxylic acid ester and carboxylic acid dichloride, and it may be one obtained, by further heat treating the result, if necessary.

The polysiloxane (A5) used in the present invention is not particularly limited, but preferably a polymer which is obtained by mixing and reacting one or more types of organosilane represented by the following formula (2) may be mentioned.

$$(R^2)_p\text{—Si—}(OR^3)_{4-p} \qquad (2)$$

In the above formula (2), $R^2$ is a hydrogen atom, alkyl group having 1 to 10 carbon atoms, alkenyl group having 2 to 10 carbon atoms, aryl group having 6 to 15 carbon atoms. The plurality of $R^2$ may be the same or different. Note that, these alkyl groups, alkenyl groups, and aryl groups may all have substituents. Further, they may be nonsubstituted groups which do not have substituents and may be selected in accordance with the properties of the composition. As specific examples of the alkyl group, a methyl group, ethyl group, n-propyl group, isopropyl group, n-butyl group, t-butyl group, n-hexyl group, n-decyl group, trifluoromethyl group, 2,2,2-trifluoroethyl group, 3,3,3-trifluoropropyl group, 3-glycidoxypropyl group, 2-(3,4-epoxy cyclohexyl) ethyl group, 3-aminopropyl group, 3-mercaptopropyl group, and 3-isocyanatepropyl group; may be mentioned. As specific examples of the alkenyl group, a vinyl group, 3-acryloxypropyl group, and 3-methacryloxypropyl group may be mentioned. As specific example of the aryl group, a phenyl group, tolyl group, p-hydroxyphenyl group, 1-(p-hydroxyphenyl)ethyl group, 2-(p-hydroxyphenyl)ethyl group, 4-hydroxy-5-(p-hydroxyphenylcarbonyloxy) pentyl group, and naphthyl group may be mentioned.

Further, in the above general formula (2), $R^3$ is a hydrogen atom, alkyl group; having 1 to 6 carbon atoms, acyl group having 1 to 6 carbon atoms, aryl group having 6 to 15 carbon atoms, where the plurality of $R^3$ may be the same or different. Note that, these alkyl groups and acyl groups may all have substituents. Further, they may be nonsubstituted groups which do not have substituents and may be selected in accordance with the properties of the composition. As specific examples of the alkyl group, a methyl group, ethyl group, n-propyl group, isopropyl group, and n-butyl group may be mentioned. As a specific example of the acyl group, an acetyl group may be mentioned. As a specific example of an aryl group, a phenyl group may be mentioned.

Furthermore, in the above general formula (2), "p" is an integer of 0 to 3. When p=0, the compound becomes tetrafunctional silane, when p=1, it becomes trifunctional silane, when p=2, it becomes bifunctional silane, and when p=3, it becomes monofunctional silane.

As specific examples of an organosilane represented by the above general formula (2), tetramethoxysilane, tetraethoxysilane, tetraacetoxysilane, tetraphenoxysilane, or other tetrafunctional silanes; methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltriraethoxysilane, vinyltriethoxysilane, 3-methacryloxypropyltrimethoxysilane, 3-methacryloxypropyltriethoxysilane, 3-acryloxypropyltriethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 2-(3,4-epoxy cyclohexyl)ethyltrimethoxysilane, 3-mercaptopropyltrimethoxysilane, or other trifunctional silanes; dimethyldimethoxysilane, dimethyldiethoxysilane, dimethyldiacetoxysilane, di-n-butyldimethoxysilane, diphenyldimethoxysilane, or other bifunctional silanes; trimethylmethoxysilane, tri-n-butylethoxysilane, or other monofunctional silanes; may be mentioned.

Among these organosilanes, from the viewpoint of the crack resistance or hardness of the obtained resin film, trifunctional silanes are preferably used. These organosilanes may be used alone or may be used as two types or more combined.

The polysiloxane (A5) used in the present invention is obtained by the hydrolysis or partial condensation of the above-mentioned organosilanes. For the hydrolysis and partial condensation, general methods can be used. For example, a solvent, water, and according to need a catalyst are added to the mixture and heated and stirred. During stirring, in accordance with need, distillation may be used to distill off the hydrolysis byproducts (methanol or other alcohol) or condensation byproduct (water).

The phenol resin (A6) used in the present invention is obtained, for example, by reacting a phenol compound, and an aldehyde, dimethylol compound, dialkoxymethyl compound, dihalomethyl compound in the presence of an acid catalyst.

The binder resin (A) used in the present invention has a weight average molecular weight (Mw) of usually 1,000 to 1,000,000, preferably 1,500 to 100,000, more preferably 2,000 to 30,000 in range.

Further, the binder resin (A) has a molecular weight distribution of a weight average molecular weight/number average molecular weight (Mw/Mn) ratio of usually 4 or less, preferably 3 or less, more preferably 2.5 or less.

The weight average molecular weight (Mw) and molecular weight distribution (Mw/Mn) of the binder resin (A) are values which are found by gel permeation chromatography (GPC) using tetrahydrofuran and other solvents as eluents and as values converted to polystyrene.

(Phenoxy Resin (B) Having Hydroxyl Equivalent of 300 or More)

The resin composition of the present invention contains a phenoxy resin (B) having a hydroxyl equivalent of 300 or more (below, suitably abbreviated as the "phenoxy resin (B)") in addition to the binder resin (A). By mixing in the phenoxy resin (B) having a hydroxyl equivalent of 300 or more, it is possible to make the heat resistance and solder heat resistance excellent while improving the elongation of the resin film and thereby possible to make the obtained resin film excellent in thermal shock resistance. Further, since it is possible to improve the elongation of the resin film, it is possible to raise the flexibility of the obtained resin film and suppress stress concentration at the interface of the resin film and substrate and possible to make the obtained resin film excellent in adhesion to a substrate.

As the phenoxy resin (B) used in the present invention, one having a hydroxyl equivalent (g/eq.) of 300 or more is suitable, but one having a hydroxyl equivalent of 303 or more is preferable and one having a hydroxyl equivalent of 310 or more is more preferable. If the hydroxyl equivalent is too low, the obtained resin film ends up becoming inferior in heat resistance and solder heat resistance. Note that the upper limit of the hydroxyl equivalent is not particularly limited, but the equivalent is preferably 1000 or less, more preferably 900 or less.

As the phenoxy resin (B), for example, one having one or more skeletons selected from a bisphenol A skeleton, bisphenol F skeleton, bisphenol S skeleton, bisphenol acetophenone skeleton, novolac skeleton, biphenyl skeleton, fluorene skeleton, dicyclopentadiene skeleton, norbornene skeleton, naphthalene skeleton, anthracene skeleton, adamantane skeleton, terpene skeleton, and trimethyl cyclohexane skeleton may be mentioned. Among these as well, from the viewpoint of being able to make the action and effects of the present invention much more remarkable, one having a bisphenol structure such as a bisphenol A skeleton, bisphenol F skeleton, bisphenol S skeleton, and bisphenol acetophenone skeleton is more preferable.

The weight average molecular weight of the phenoxy resin (B) used in the present invention is not particularly limited, but is preferably 5,000 to 200,000, more preferably 10,000 to 150,000, still more preferably 15,000 to 100,000.

If the weight average molecular weight is in the above range, the effect of addition of the phenoxy resin (B) can be enhanced more.

In the resin composition of the present invention, the content of the phenoxy resin (B) is preferably 2 to 75 wt % with respect to 100 wt % of a total solid content forming the resin composition of the present invention (that is, 100 wt % of the ingredients contained after removal of the volatile ingredients such as the solvent), more preferably 3 to 70 wt %, still more preferably 4 to 65 wt %, even more preferably 6 to 30 wt %, particularly preferably 10 to 25 wt %. If the content of the phenoxy resin (B) with respect to a total solid content forming the resin composition of the present invention is too small, sometimes the effect of improvement of the adhesion to a substrate and thermal shock resistance will no longer be obtained, while if too great, sometimes the heat resistance and solder heat resistance will fall. Note that the content of the phenoxy resin (B) need only be made the above range with respect to a total solid content forming the resin composition of the present invention, but the content with respect to 100 parts by weight of the binder resin (A) is preferably 2 to 350 parts by weight, more preferably 3 to 325 parts by weight, still more preferably 4 to 300 parts by weight, even more preferably 10 to 45 parts by weight, particularly preferably 15 to 40 parts by weight.

(Cross-Linking Agent (C))

The resin composition of the present invention contains the cross-linking agent (C) in addition to the binder resin (A) and phenoxy resin (B). As the cross-linking agent (C), one forming a cross-linked structure between cross-linking agent molecules due to heating or one reacting with the binder resin (A) and forming a cross-linked structure between resin molecules, specifically a compound having two or more reactive groups, may be mentioned. The compound having reactive groups is not particularly limited, but for example an epoxy group-containing cross-linking agent, oxetane group-containing cross-linking agent, isocyanate group-containing cross-linking agent, block isocyanate group-containing cross-linking agent, oxazoline group-containing cross-linking agent, maleimide group-containing cross-linking agent, (meth)acrylate group-containing cross-linking agent, compound containing two or more alkoxymethyl groups or methylol groups in its molecule, etc. may be mentioned. Among these as well, an epoxy group-containing cross-linking agent and a compound containing two or more alkoxymethyl groups or methylol groups in its molecule are preferable. From the viewpoint of being able to make the action and effect of the present invention more remarkable, an epoxy group-containing cross-linking agent and a compound containing two or more alkoxymethyl groups or methylol groups in its molecule are more preferably jointly used.

As specific examples of the epoxy group-containing cross-linking agent, for example, an epoxy compound having an alicyclic structure such as an epoxy compound having dicyclopentadiene as a skeleton (product name "HP-7200", made by DIC), a 1,2-epoxy-4-(2-oxiranyl)cyclohexane adduct of 2,2-bis(hydroxymethyl)1-butanol (15-functional alicyclic epoxy resin having a cyclohexane skeleton and terminal epoxy group, product name "EHPE3150", made by Daicel Chemical Industries), an epoxylated 3-cyclohexene-1,2-dicarboxylic acid bis(3-cyclohexenylmethyl)-modified ε-caprolactone (aliphatic cyclic trifunctional epoxy resin, product name "Epolide GT401", made by Daicel Chemical Industries), epoxylated butanetetracarboxylic acid tetrakis (3-cyclohexenylmethyl)-modified ε-caprolactone (aliphatic cyclic tetrafunctional epoxy resin, product name "Epolide GT401", made by Daicel Chemical Industries), 3,4-epoxycyclohexenylmethyl-3',4'-epoxycyclohexenecarboxylate (product names "Celloxide 2021" and "Celloxide 2021P", made by Daicel Chemical Industries), ε-caprolactone-modified 3',4'-epoxycyclohexylmethyl-3,4-epoxycyclohexane carboxylate (product, name "Celloxide 2081", made by Daicel Chemical Industries), 1,2:8,9-diepoxylimonene (product name "Celloxide 3000", made by Daicel Chemical Industries), and 2-(3,4-epoxycyclohexyl)ethyltrimethoxysilane (product, name "Z-6043", made by Toray-Dow Corning);

an epoxy compound not having an alicyclic structure such as a bisphenol A type epoxy compound (product names "jER 825", "jER 827", "jER 828", and "jER YL980", made by Mitsubishi Chemical and product names "EPICLON 840" and "EPICLON 350", made by DIC), a bisphenol F type epoxy compound (product names "jER 806", "jER 807", and "jER YL983U", made by Mitsubishi Chemical, and product names "EPICLON 830" and "EPICLON 835", made by DIC), hydrated bisphenol A type epoxy compound (product names "jER YX8000" and "jER YX8034", made by Mitsubishi Chemical, product name "ST-3000", made by Nippon Steel & Sumitomo Metal, product name "Rikaresin HBE-100", made by Mew Japan Chemical, and product name "Epolite 4000", made by Kyoei Kagaku Kogyou), a long chain bisphenol A type epoxy resin (product names "EXA-4816", "EXA-4850-150", and "EXA-4850-1000", made by DIC), EO-modified bisphenol A type epoxy compound (product names "Adeka Resin EP-4000L" and "Adeka Resin EP-4010L", made by Adeka), phenol novolac type polyfunctional epoxy compound (product name "jER 152", made by Mitsubishi Chemical), a polyfunctional epoxy compound having a naphthalene structure such as 1,6-bis(2,3-epoxypropan-1-yloxy)naphthalene (product name "HP-4032D", made by DIC), dicyclopentadiene dimethanol diglycidyl ether (product names "Adeka Resin EP-4000L" and "Adeka Resin EF-4088L", made by Adeka), glycidyl amine type epoxy resin (product name "product name "jER630", made by Mitsubishi Chemical, product names "TETRAD-C" and "TETRAD-X", made by Mitsubishi Gas Chemical), chain type alkylpolyfunctional epoxy compound (product name "SR-TMP", made by Sakamoto Yakuhin Kogyo), polyfunctional epoxy polybutadiene (product name "Epolide PB3600", made by Daicel Chemical Industries), (product name "Epolide PB4700", made by Daicel Chemical Industries), a glycidyl polyether compound of glycerin (product name "SR-GLG", made by Sakamoto Yakuhin Kogyo), a diglycerin polyglycidyl ether compound (product name "SR-DGE", made by Sakamoto Yakuhin Kogyo), polyglycerin polyglycidyl ether compound (product name "SR-4GL", made by Sakamoto Yakuhin Kogyo), and γ-glycidoxypropyltrimethylsilane (product name "Z6040", made by Dow Corning Toray); etc. may be mentioned.

Among these epoxy group-containing cross-linking agents, an epoxy compound having an alicyclic structure, that is, alicyclic epoxy compound, is preferable.

The compound containing two or more alkoxymethyl groups in its molecule is not particularly limited so long as a compound having two or more alkoxymethyl groups. As a phenol compound having two or more alkoxymethyl groups directly bonded to an aromatic ring, for example, dimethoxymethyl substituted phenol compound such as 2,6-dimethoxymethyl-4-t-butyl phenol and 2,6-dimethoxymethyl-p-cresol, tetramethoxymethyl substituted biphenyl compound such as 3,3',5,5'-tetramethoxymethyl-4,4'-dihydroxybiphenyl (for example, product name "TMOM-BP", made by Honshu Chemical Industry) and 1,1-bis[3,5-di(methoxymethyl)-4-hydroxyphenyl]-1-phenylethane, hexamethoxymethyl substituted triphenyl compound such as 4,4',4"-(ethylidene)trisphenol and other hexamethoxymethyl substituted compound (for example, product name "HMOM-TPHAP-GB", made by Honshu Chemical Industry), etc. may be mentioned.

The compound including two or more methylol groups in its molecule is not particularly limited so long as a compound including two or more methylol groups. As a phenol compound having two or more methylol groups directly bonded to an aromatic ring, 2,4-2,4-dihydroxymethyl-6-methyl phenol, 2,6-bis(hydroxymethyl)-p-cresol, 4-tertiary-2,6-bis(hydroxymethyl) phenol, bis(2-hydroxy-3-hydroxymethyl-5-methylphenyl)methane (product, name "DM-BIPC-F", made by Asahi Yukizai), bis(4-hydroxy-3-hydroxymethyl-5-methylphenyl)methane (product name "DM-BIOC-F", made by Asahi Yukizai), 2,2-bis(4-hydroxy-3,5-dihydroxymethylphenyl)propane (product name "TM-BIP-A", made by Asahi Yukizai), etc. may be mentioned.

As a melamine compound with an amino group substituted, by two or more alkoxymethyl groups used as a compound containing two or more alkoxymethyl groups in its molecule, for example, N,N'-dimethoxymethyl melamine, N,N',N"-trimethoxymethyl melamine, N,N,N',N"-tetramethoxymethyl melamine, N,N,N',N',N"-pentamethoxymethyl melamine, N,N,N',N',N",N"-hexamethoxymethyl melamine (for example, "Nikalac MK-390LM" and "Nikalac MX290", made by Sanwa Chemical), or polymers of the same etc. may be mentioned.

As a urea compound substituted by two or more alkoxymethyl groups used as a compound containing two or more alkoxymethyl groups in its molecule, "Nikalac MX270", made by Sanwa Chemical, "Nikalac MX280", made by Sanwa Chemical, "Nikalac MX290", made by Sanwa Chemical, etc. may be mentioned.

The compound containing two or more alkoxymethyl groups or methylol groups in its molecule can be used as single types alone or in combinations of two or more types.

Among these as well, from the viewpoint of the high reactivity, N,N,N',N',N",N"-hexamethoxymethyl melamine is preferable.

The molecular weight of the cross-linking agent (C) is not particularly limited, but is usually 50 to 100,000, preferably 80 to 10,000, more preferably 100 to 5,000. The Cross-linking agent (C) can be used as single types alone or in combinations of two or more types.

In the resin composition of the present invention, the content of the cross-linking agent (C) is preferably 1 to 80 parts by weight with respect to 100 parts by weight of the binder resin (A), more preferably 5 to 75 parts by weight, still more preferably 10 to 70 parts by weight. By making the content of the cross-linking agent (C) this range, it is possible to more suitably raise the heat resistance of the resin film obtained by the resin composition of the present invention. Note that when using two or more types of compounds as the cross-linking agent (C), the total content may be made the above range.

(Photoacid Generator (D))

Further, the resin composition of the present invention may contain a photoacid generator (D) in addition to the binder resin (A), phenoxy resin (B), and cross-linking agent (C). By including a photoacid generator (D), the photoacid generator (D) causes a chemical reaction if irradiated by radiation such as ultraviolet rays or electron beams, and it is possible to change the alkali solubility of the resin film formed by the resin composition and enable the resin film obtained by this to be patterned.

As the photoacid generator (D), for example, an acetophenone compound, triaryl sulfonium salt, an aside compound such as a quinone diazide compound, etc. may be mentioned, but preferably it is an azide compound, particularly preferably a quinone diazide compound.

As a quinone diazide compound, for example, an ester compound of a quinone diazide sulfonyl halide and a compound having a phenolic hydroxyl group may be used. As specific examples of a quinone diazide sulfonyl halide, 1,2-naphthoquinone diazide-5-sulfonyl chloride, 1,2-naphthoquinone diazide-4-sulfonyl chloride, 1,2-benzoquinone diazide-5-sulfonyl chloride, etc. may be mentioned. As typical examples of a compound having a phenolic hydroxy group, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, etc. may be mentioned. As a compound having a phenolic hydroxy group other than these, 2,3,4-trihydroxybenzophenone, 2,3,4,4'-tetrahydroxybenzophenone, 2-bis(4-hydroxyphenyl)propane, tris(4-hydroxyphenyl)methane, 1,1,1-tris(4-hydroxy-3-methylphenyl)ethane, 1,1,2,2-tetrakis(4-hydroxyphenyl)ethane, an oligomer of a novolac resin, an oligomer obtained by copolymerization of a compound having one or more phenolic hydroxy groups and dicyclopentadiene, etc. may be mentioned.

Further, as the photoacid generator (D), in addition to a quinone diazide compound, a known one such as an onium salt, halogenated organic compound, α,α'-bis(sulfonyl)diazomethane-based compound, α-carbonyl-α'-sulfonyl diazomethane-based compound, sulfone compound, organic acid ester compound, organic acid amide compound, and organic imide compound can be used.

These photoacid generators (D) can be used as single types alone or in combinations of two or more types.

In the resin composition of the present invention, the content of the photoacid generator (D) is preferably 5 to 100 parts by weight with respect to 100 parts by weight of the binder resin (A), more preferably 10 to 60 parts by weight, still more preferably 15 to 40 parts by weight. If the content of the photoacid generator (D) is in this range, when patterning the resin film comprised of the resin composition, the difference in solubility in the developing solution between the radiated parts and unradiated parts becomes greater, the radiation sensitivity also becomes higher, and patterning by development is easier, so this is preferable.

(Other Compounding Agents)

Further, the resin composition of the present invention may further contain a solvent. The solvent is not particularly limited, but one known as a solvent of a resin composition, for example, acetone, methylethylketone, cyclopentanone, 2-hexanone, 3-hexanone, 2-heptanone, 3-heptanone, 4-heptanone, 2-octanone, 3-octanone, 4-octanone, or other straight chain ketones; n-propyl alcohol, isopropyl alcohol, n-butyl alcohol, cyclohexanol, or other alcohols; ethyleneglycol dimethyl ether, ethyleneglycol diethyl ether, dioxane, or other ethers; ethyleneglycol monomethyl ether, ethyleneglycol monoethyl ether, or other alcohol ethers; propyl formate, butyl formate, propyl acetate, butyl acetate, methyl propionate, ethyl propionate, methyl butyrate, ethyl butyrate, methyl lactate, ethyl lactate, or other esters; cellosolve acetate, methylcellosolve acetate, ethylcellosolve acetate, propylcellosolve acetate, butylcellosolve acetate, or other cellosolve esters; propyleneglycol, propyleneglycol monomethyl ether, propylene glycol monomethyl ether acetate, propylene glycol monoethyl ether acetate, propylene glycol monobutyl ether, or other propylene glycols; diethylene glycol monomethyl ether, diethylene glycol monoethyl ether, diethylene glycol dimethyl ether, diethylene glycol diethyl ether, diethylene glycol methylethyl ether, or other diethylene glycols; γ-butyrolactone, γ-valerolactone, γ-caprolactone, γ-caprylolactone, or other saturated γ-lactones; trichloroethylene or other halogenated hydrocarbons; toluene, xylene, or other aromatic hydrocarbons; dimethylacetoamide, dimethylformamide, N-methylacetoamide, or other polar solvents; etc. may be mentioned. These solvents may be used alone or as two types or more combined. The content of the solvent is preferably 10 to 10000 parts by weight with respect to 100 parts by weight, of the binder resin (A), more preferably 50 to 5000 parts by weight, furthermore preferably 100 to 1000 parts by weight in range. Note that, when the resin composition is made to include a solvent, the solvent is normally removed after forming the resin film.

Further, the resin composition of the present invention may contain, if desired, in a range in which the effect of the present invention is not impaired, another compounding agent such as a compound having an acidic group or thermal latent acid group, a surfactant, sensitizer, photostabilizer, defoamer, pigment, dye, and filler. Among these, for example, for the compound having an acidic group or thermal latent acid group, ones described in Japanese Patent. Publication No. 2014-29766A etc. may be used. Further, for the surfactant, sensitizer, and photostabilizer, ones described in Japanese Patent Publication No. 2011-75605A etc. may be used. However, among these other compounding agents, from the viewpoint of the drop in fluidity of the resin composition and the deterioration of the adhesion, the content of the filler is preferably made not more than 80 wt % with respect to 100 wt % of a total solid content forming the resin composition of the present invention. Further, from the viewpoint of reducing the unevenness when coating the resin composition of the present invention, the amount of the filler is more preferably as low as 0 wt. %. That is, it is more preferable that the filler (in particular inorganic filler) substantially not be contained. Note that the filler may be one which is not soluble in the binder resin (A) used in the present invention and does not change in shape upon, usual external force and thereby acts as a filler. The shape may be any shape such as particles, flakes, and fibers. As the filler, for example, inorganic fillers such as polyimide particles, silica, and carbon black, organic fillers such as rubber particles, etc. may be mentioned.

The method of preparation of the resin composition of the present invention is not particularly limited. It is sufficient to mix the ingredients forming the resin composition by a known method.

The method of mixing is not particularly limited, but mixing a solution or dispersion obtained by dissolving or dispersing the ingredients forming the resin composition in a solvent is preferable. Due to this, the resin composition is obtained in the form of a solution or dispersion.

The method of dissolving or (dispersing the ingredients forming the resin composition may be an ordinary method. Specifically, this may be performed by stirring using a physical stirrer and magnetic stirrer, a high speed homogenizer, disperser, planetary stirrer, twin screw stirrer, ball mill, triple roll, etc. Further, it is possible to dissolve or disperse the components in a solvent, then, for example, filter the result using a filter with a pore size of 0.5 μm or so.

The solid concentration of the resin composition of the present invention is usually 1 to 70 wt %, preferably 5 to 60 wt %, more preferably 10 to 50 wt %. If the solid concentration is in this range, stability of dissolution, coatability, uniformity of thickness and flatness of the resin film which is formed, etc. are obtained in a high balance.

(Electronic Device)

The electronic device of the present invention has a resin film comprised of the above-mentioned resin composition of the present invention.

The electronic device of the present invention is not particularly limited, but a resin film comprised of the resin composition of the present invention is excellent, in heat resistance, adhesion to a substrate, solder heat resistance, and thermal shock, resistance, so the electronic device is preferably one produced by the wafer level package technology. In particular, a resin film comprised of the resin composition of the present invention is more preferably used for forming an interlayer insulating film for insulating between interconnects laid out in layers in an electronic device produced by the wafer level package technology.

In the electronic device of the present invention, the method of forming the resin film is not particularly limited. For example, a method such as the coating method or film lamination method may be used.

The coating method is, for example, the method of coating a resin composition, then drying by heating to remove the solvent. As the method of coating the resin composition, for example, various methods such as spray method, spin coat method, roll coat method, die coat method, doctor blade method, spin coat method, bar coat method, screen print method, and inkjet method can be employed. The heating and drying conditions differ according to the type and ratio of the ingredients, but are usually 30 to 150° C., preferably 60 to 120° C. usually for 0.5 to 90 minutes, preferably 1 to 60 minutes, more preferably 1 to 30 minutes.

The film lamination method is a method comprising coating a resin composition on a resin film, metal film or other substrate for forming B-stage film, then heating and drying it to remove the solvent to obtain the B-stage film, then laminating this B-stage film. The heating and drying conditions may be suitably selected in accordance with the types and ratios of content of the ingredients, but the heating temperature is usually 30 to 150° C. and the heating time is usually 0.5 to 90 minutes. The film lamination may be performed by using a press laminator, press, vacuum laminator, vacuum press, roll laminator, and other press bonding machines.

The thickness of the resin film is not particularly limited and may be suitably set in accordance with the application, but is preferably 0.1 to 100 µm, more preferably 0.5 to 50 µm, still more preferably 0.5 to 30 µm.

Further, the resin film which is formed by the above-mentioned coating method or film lamination method, is cross-linked. This cross-linking may be performed, by selecting a suitable method in accordance with the type of the cross-linking agent (C), but usually is performed by heating. The heating method, for example, may be one using a hot plate, oven, etc. The heating temperature is usually 150 to 250° C. The heating time is suitably selected in accordance with the area or thickness of the resin film, the equipment which is used, etc. For example, when using a hot plate, it is normally 5 to 60 minutes, while when using an oven, it is normally 30 to 300 minutes. The heating may be performed in accordance with need in an inert gas atmosphere. The inert gas may be one which does not contain oxygen and which does not oxidize a resin film. For example, nitrogen, argon, helium, neon, xenon, krypton, etc. may be mentioned. Among these as well, nitrogen and argon are preferable. In particular, nitrogen is preferable. In particular, inert gas with an oxygen content of 0.1 vol % or less, preferably 0.01 vol % or less, in particular nitrogen, is suitable. These inert gases may be respectively used alone or as two types or more combined.

Further, the resin film comprised of the resin composition can be patterned if necessary. As the method, of patterning the resin film, for example, the method of including a photoacid generator (D) in the resin composition, forming a resin film before patterning, irradiating active radiation at the resin film before patterning to form latent patterns, then bringing the resin film which has the latent patterns into contact, with the developing solution to bring out the patterns etc. may be mentioned. Alternatively, as the method of patterning, as a method other than a method using the photoacid generator (D), the method of using laser processing using a $CO_2$ laser or UV-YAG laser etc. or the method of forming a mask pattern on the resin film and then dry etching or further the inkjet method or other direct lithographic method etc. may be used.

The active radiation is not particularly limited so long as able to activate the photoacid generator (D) contained in the resin composition and change the alkali solubility of the resin composition containing the photoacid generator (D). Specifically, ultraviolet light, g-h-i-rays and other single wavelength ultraviolet light, KrF excimer laser light, ArF excimer laser light, and other light beams; electron beams and other particle beams; etc. may be used. As the method of selectively radiating active radiation in a pattern manner to form latent patterns, an ordinary method may be used. For example, the method of using a reduced projection exposure apparatus etc. to irradiate ultraviolet light, g-h-i-rays, KrF excimer laser light, ArF excimer laser light, and other light beams through a desired mask pattern or the method of using an electron beam or other particle beam for lithography etc. may be used. When using light beams as active radiation, single wavelength light or mixed wavelength light may be used. The irradiation conditions may be suitably selected in accordance with the active radiation used, but, for example, when using wavelength 200 to 450 nm light beams, the amount of irradiation is normally 10 to 1,000 $mJ/cm^2$, preferably 50 to 500 $mJ/cm^2$ in range and is determined in accordance with the irradiation time and illuminance. After irradiating the active radiation in this way, in accordance with need, the resin film is heat treated at 60 to 130° C. or so in temperature for 1 to 2 minutes or so.

Next, the latent patterns which are formed in the resin film before patterning are developed to bring them out. As the developing solution, normally aqueous solutions of alkali compounds may be used. As; alkali compounds, for example, alkali metal salts, amines, and ammonium salts may be used. The alkaline compounds may be inorganic compounds or organic compounds. As specific examples of these compounds, sodium hydroxide, potassium hydroxide, sodium carbonate, sodium silicate, sodium metasilicate, and other alkali metal salts; ammonia water; ethylamine, n-propylamine, and other primary amines; diethylamide, di-n-propylamine, and other secondary amines; triethylamine, methyldiethylamine, and other tertiary amines; tetramethylammonium hydroxide, tetraethylammonium hydroxide, tetrabutylammonium hydroxide, choline, and other quaternary ammonium salts; dimethylethanolamine, triethanolamine, and other alcohol amines; pyrrol, piperidine, 1,8-diazabicyclo[5.4.0]undec-7-ene, 1,5-diazabicyclo[4.3.0]non-5-ene, N-methylpyrrolidone, and other cyclic amines; etc. may be mentioned. These alkali compounds may be respectively used, alone or as two types or more combined.

As the aqueous medium of the alkali aqueous solution, water; methanol, ethanol, and other water soluble organic solvents may be used. The alkali aqueous solution may have a surfactant etc. added in a suitable amount.

As the method for bringing the developing solution in contact with the resin film which has the latent patterns, for example, the puddle method, spray method, dipping method, and other methods may be used. The development conditions are suitably selected as normally 0 to 100° C., preferably 5 to 55° C., more preferably 10 to 30° C. and normally 30 to 180 seconds.

The resin film formed with the targeted patterns in this way may, in accordance with need, be rinsed by a rinse solution to remove the developer residue. After the rinsing, the remaining rinse solution is removed by compressed air or compressed nitrogen.

Furthermore, in accordance with need, to deactivate the photoacid generator (D) contained in the resin composition, it is possible to irradiate the entire surface of the electronic device with activating radiation. The activating radiation can be irradiated utilizing the method illustrated for formation of the above latent patterns. The resin film may be heated at the same time as irradiation or after irradiation. As the heating method, for example, the method of heating the electronic device by a hot plate or in an oven may be mentioned. The temperature is usually 100 to 300° C., preferably 120 to 200° C. in range.

In the present invention, the resin film may be cross-linked after patterning. The cross-linking can be performed by the above-mentioned method.

The resin composition of the present invention contains a binder resin (A), a phenoxy resin (B) with a hydroxyl equivalent of 300 or more, and a cross-linking agent (C), so the resin film obtained by using such a resin composition of the present invention is excellent in heat resistance, adhesion to a substrate, solder heat resistance, and thermal, shock resistance. For this, reason, such a resin, film obtained, using the resin composition of the present, invention can be suitably used for electronic devices, in particular electronic devices produced by wafer level package technology.

EXAMPLES

Below, examples and comparative examples will be given to explain the present invention more specifically. In the examples, "parts" are based on weight unless otherwise indicated.

Note that the definitions and methods of evaluation of the different characteristics are as follows:

<Heat Resistance>

A resin composition was spin coated on a silicon wafer formed with a thin film of aluminum of a thickness of 100 nm using a sputtering apparatus, then was heated using a hot plate at 120° C. for 2 minutes. Next, the composition was cured in a nitrogen atmosphere at 200° C. for 60 minutes to form a resin film of a thickness of 10 μm and thereby obtain a laminate. The obtained laminate was cut into a predetermined size, then the aluminum film was made to dissolve in a 0.1 mol/L hydrochloric acid aqueous solution and the remaining film was peeled off. The peeled off film was dried to obtain the resin film. Further, the obtained resin film was measured for glass transition temperature (° C.) of the resin film using a viscoelasticity spectrometer (SII Nanotechnology, DMS6100 standard model) and was evaluated for heat resistance by the following criteria. The higher the glass transition temperature, the better the heat resistance can be judged to be.

A: Glass transition temperature of 160° C. or more
B: Glass transition temperature of 150° C. to less than 160° C.
C: Glass transition temperature of less than 150° C.

<Adhesion to Substrate>

A resin composition was spin coated on a silicon wafer formed with a film of copper of a thickness of 100 nm on a film of titanium of a thickness of 50 nm using a sputtering apparatus, then was heated using a hot plate at 120° C. for 2 minutes. Next, the composition was cured in a nitrogen atmosphere at 200° C. for 60 minutes to form a resin film of a thickness of 10 μm and thereby obtain a laminate. The resin film forming the obtained laminate was subjected to a cross cut test. Specifically, first, a cutter knife was used to cut the resin film forming the laminate into a grid of 10×10=100 squares of 1 mm×1 mm size. Further, cellophane tape was strongly pressed against the grid parts then the cellophane tape was stripped off all at once from the end by an angle of 45°. The remaining ratio of resin film (ratio of resin film remaining on silicon wafer formed with a film of copper to a thickness of 100 nm on a titanium film of 50 nm thickness using a sputtering apparatus) was found. The following criteria were used to evaluate the adhesion to a substrate.

A: Remaining ratio of resin film of 90% or more
B: Remaining ratio of resin film of 80% to less than 90%
C: Remaining ratio of resin film of less than 80%

<Solder Heat Resistance>

A resin composition was spin coated on a silicon wafer formed with a film of copper of a thickness of 100 nm on a film of titanium of a thickness of 50 nm using a sputtering apparatus, then was heated using a hot plate at 1.20° C. for 2 minutes. Next, the composition was cured in a nitrogen atmosphere at 200° C. for 60 minutes to form a resin film of a thickness of 10 μm and thereby obtain a laminate. On the resin film of the thus obtained laminate, copper foil was formed by the sputtering method. Next, this was electroplated using an acid aqueous solution containing copper sulfate as a plating bath to thereby form a copper plating layer of a thickness of 10 μm, then this was heat treated at 180° C. for 60 minutes to thereby obtain a test piece. Further, the obtained test piece was floated in a solder bath of a solder temperature of 260° C. for 10 seconds, allowed to stand at room temperature for 30 seconds, then was repeatedly tested to check for the presence of any blistering of the copper plating layer until blistering of the copper plating layer was confirmed. The following criteria were used to evaluate the solder heat resistance. The greater the number of times of repetition of the test until blistering of the copper plating layer is confirmed, the better the solder heat resistance can be judged as.

A: Above test repeated 10 times, but no blistering of copper plating layer could be confirmed even after 10th test.
B: Number of times of repetition of test until blistering of copper plating layer is confirmed was 8 times to 10 times.
C: Number of times of repetition of test until blistering of copper plating layer is confirmed was less than 8 times.

<Thermal Shock Resistance>

A resin composition was spin coated on the substrate for evaluation of thermal shock having patterns of copper interconnects on a silicon wafer, then was heated in a nitrogen atmosphere at 120° C. for 2 minutes, then was cured at 200° C. for 60 minutes to form a resin film of a thickness of 10 μm and thereby obtain a sample for evaluation. Further, the obtained sample for evaluation was tested for thermal shock using a thermal shock tester (made by Tabai Espec) in cycles of −55° C./30 minutes and 150° C./30 minutes. The number of cycles until cracks formed in the resin film was confirmed. The following criteria were used to evaluate the thermal shock resistance.

A: No cracks formed even after elapse of 1000 cycles
C: Cracks formed before reaching 1000 cycles <<Synthesis Example 1>>
<Preparation of Cyclic Olefin Polymer (A-1)>

100 parts of a monomer mixture comprised of 40 mol % of N-phenyl-bicyclo[2.2.1]hept-5-ene-2,3-dicarboxyimide (NBPI) and 60 mol % of 4-hydroxycarbonyltetracyclo[6.2.1.1$^{3,6}$.0$^{2,7}$]dodec-9-ene (TCDC), 2.0 parts of 1,5-hexadiene, 0.02 part of (1,3-dimesityl imidazolin-2-ylidene)(tricyclohexyl phosphine)benzylidene ruthenium dichloride (synthesized by method described in Org. Lett., vol. 1, p. 953, 1999), and 200 parts of diethylene glycol ethyl methyl ether were charged into a glass pressure resistant reactor inside of which the atmosphere was substituted with nitrogen. These were stirred while causing them to react at 80° C. for 4 hours to obtain a polymerization reaction solution.

Further, the obtained polymerization reaction solution was placed: into an autoclave and stirred at 150° C. and a hydrogen pressure of 4 MPa for 5 hours to cause a hydrogenation reaction, and obtain a polymer solution containing a cyclic olefin polymer (A-1). The polymerization conversion rate of the obtained cyclic olefin polymer (A-1) was 99.7%, the weight average molecular weight converted to polystyrene was 7,150, the number average molecular weight was 4,690, the molecular weight distribution was 1.52, and the hydrogenation rate was 99.7%. Further, the solid concentration of the obtained polymer solution of the cyclic olefin polymer (A-1) was 34.4 wt. %.

Example 1

291 parts of a binder resin (A) comprised of a polymer solution of the cyclic olefin polymer (A-1) obtained in Synthesis Example 1 (100 parts as cyclic olefin polymer (A-1)), 25 parts of a phenoxy resin (B) comprised of a phenoxy resin containing a bisphenol S skeleton (product, name "jER YX8100BH30", made by Mitsubishi Chemical Corporation, hydroxyl equivalent 308), 30 parts of a cross-linking agent (C) comprised of epoxylated butanetetracarboxylic acid tetrakis(3-cyclohexenylmethyl)-modified ε-caprolactone (product name "Epolide GT401", made by Daicel Chemical Industries, aliphatic cyclic tetrafunctional epoxy resin), 10 parts of a cross-linking agent (C) comprised of a long chain bisphenol A type epoxy resin (product name "EXA-4816", made by DIG), 15 parts of a cross-linking agent (C) comprised of N,N,N',N',N'',N''-hexamethoxymethyl melamine (product name "Nikalac MS-100LM", made by Sanwa Chemical), 3 parts of a silane coupling agent comprised of γ-glycidoxypropyl trimethoxysilane (product name "Z6040", made by Toray-Dow Corning), and 160 parts of a solvent comprised of diethyleneglycol ethylmethyl ether were mixed and made to dissolve, then were filtered by a pore size 0.45 μm polytetrafluoroethylene filter to prepare a resin composition.

Further, using the obtained resin composition, the heat resistance, adhesion to a substrate, solder heat resistance, and thermal shock resistance were measured and evaluated. The results are shown in Table 1.

Examples 2 to 6

Except for using the compounds shown in Table 1 in the amounts shown in Table 1, the same procedures were followed as in Example 1 to prepare resin compositions and the same procedures were followed to evaluate them. The results are shown in Table 1.

Comparative Examples 1 and 2

Except for using the compounds shown in Table 1 in the amounts shown in Table 1, the same procedures were followed as in Example 1 to prepare resin compositions and the same procedures were followed to evaluate them. The results are shown in Table 1.

TABLE 1

| | | | Examples | | | | | | Comparative Examples | |
|---|---|---|---|---|---|---|---|---|---|---|
| | | | 1 | 2 | 3 | 4 | 5 | 6 | 1 | 2 |
| Binder resin | Cyclic olefin polymer (A-1) | (parts) | 100 | 100 | 100 | 100 | | | 100 | |
| | Acrylic polymer (Maruka Linker CMM) | (parts) | | | | | 100 | 100 | | 100 |
| Phenoxy resin | jER YX8100BH30 (hydroxyl equivalent 308) | (parts) | 25 | | | 35 | 30 | | | |
| | jER YX6954BH30 (hydroxyl equivalent 325) | (parts) | | 30 | 25 | | | 20 | | |
| | jER 1256B40 (hydroxyl equivalent 284) | (parts) | | | | | | | 30 | |
| | Phenotot YP-70 (hydroxyl equivalent 274) | (parts) | | | | | | | | |
| Compound containing alkoxymethyl group or methylol group | Nikalac MW100LM | (parts) | 15 | | | 10 | | | | 10 |
| | TMOM-BP | (parts) | | 10 | | | | 20 | | |
| | HMOM-TPHAP-GB | (parts) | | | 5 | | 5 | | | |
| Epoxy group-containing cross-linking agent | Epolide GT401 | (parts) | 30 | 35 | 40 | 20 | 30 | | 40 | 30 |
| | EXA-4816 | (parts) | 10 | | 20 | | | | | |
| Photoacid generator | TS200 | (parts) | | | 20 | 20 | 20 | | | |
| Silane coupling agent | Z6040 | (parts) | 3 | 3 | | | | 3 | 3 | |
| | Z6883 | (parts) | | | 3 | 3 | 3 | | | 3 |
| Results of evaluation | Heat resistance | | A | A | A | A | A | A | C | A |
| | Adhesion to substrate | | B | A | A | A | B | B | A | C |
| | Solder heat resistance | | A | A | A | B | A | A | C | C |
| | Thermal shock resistance | | A | A | A | A | A | A | A | C |

Note that in Table 1, the compounds shown are as follows:
Binder resin "Cyclic olefin polymer (A-1)": cyclic olefin polymer (A-1) obtained in Synthesis Example 1
Binder resin "Acrylic polymer (Maruka Linker CMM)": acrylic polymer (product name "Maruka Linker CMM", made by Maruzen Petrochemical, copolymer of p-hydroxystyrene and methyl methacrylate)
Phenoxy resin "jER YX8100BH30": phenoxy resin, containing bisphenol S skeleton (product name "jER YX8100BH30", made by Mitsubishi Chemical Corporation, hydroxyl equivalent 308)
Phenoxy resin "jER YX6954BH30": phenoxy resin, containing bisphenol acetophenone skeleton (product name "jER YX6954BH30", made by Mitsubishi Chemical Corporation, hydroxyl equivalent 325)
Phenoxy resin "jER 1256B40": phenoxy resin containing bisphenol A skeleton (product name "jER 1256B40", made oy Mitsubishi Corporation, hydroxyl equivalent 284)
Phenoxy resin "Phenotot YP-70": bisphenol A-bisphenol F copolymer phenoxy resin (product name "Phenotot YP-70", made by Nippon Steel & Sumitomo Chemical, hydroxyl equivalent 270)
Compound containing two or more alkoxymethyl groups or methylol groups "Nikalac E-M100LM": N,N,N',N',N",N"-hexamethoxymethyl melamine (product name "Nikalac M3-100LM", made by Sanwa Chemical)
Compound containing alkoxymethyl group or methylol group: "TMOM-BP": 3,3',5,5'-tetramethoxymethyl-4,4'-bisphenol (product name "TMOM-BP", made by Honshu Chemical Industry)
Compound containing two or more alkoxymethyl groups or methylol groups "HMOM-TPHAP-GB": 4,4',4'-(ethylidene)trisphenol and other hexamethoxymethyl substituted compound (product name "HMOM-TP-HAP-GB", made by Honshu Chemical Industry)
Epoxy group-containing cross-linking agent "Epolide GT401": epoxylated butanetetracarboxylic acid tetrakis is cyclohexenylmethyl)-modified ε-caprolactone (product name "Epolide GT401", made by Daicel Chemical Industries, aliphatic cyclic tetrafunctional epoxy resin)
Epoxy group-containing cross-linking agent "EXA-4816": long chain bisphenol A type epoxy resin (product name "EXA-4816", made by DIC)
Photoacid generator "TS200": condensate of 4,4'-[1-[4-[1-[4-hydroxyphenyl]-1-methylethyl]phenyl]ethylidene]bisphenol (1 mole) and 1,2-naphthoquinone diazide-5-sulfonyl chloride (2.0 moles) (product name "TS200", made by Toyogosei)
Silane coupling agent "Z6040": γ-glycidoxypropyl trimethoxysilane (product name "Z6040", made by Toray-Dow Corning)
Silane coupling agent "Z6883": 3-phenylaminopropyl trimethoxysilane (product name "Z6883", made by Toray-Dow Corning)

As shown in Table 1, resin films obtained using a resin composition containing a binder resin (A), a phenoxy resin (B) with a hydroxyl equivalent of 300 or more, and a cross-linking agent (C) were excellent in each of heat resistance, adhesion to a substrate, solder heat resistance, and thermal shock resistance (Examples 1 to 6).

On the other hand, when using a phenoxy resin with a hydroxyl equivalent of less than 300, the obtained resin film was inferior in heat resistance and solder heat resistance (Comparative Example 1).

Further, when not mixing in a phenoxy resin (B) with a hydroxyl equivalent of 300 or more, the obtained resin film was inferior in adhesion to a substrate, solder heat resistance, and thermal shock resistance (Comparative Example 2).

The invention claimed is:

1. A resin composition comprising a binder resin (A), a phenoxy resin (B) having an hydroxyl equivalent of 300 or more, and a cross-linking agent (C),
    wherein the cross-linking agent (C) is a compound including two or more alkoxymethyl groups or methylol groups in its molecule.

2. The resin composition according to claim 1 further comprising a filler in a content of 80 wt % or less with respect to a total solid content forming the resin composition.

3. The resin composition according to claim 2 wherein a content of the filler is 0 wt % with respect to a total solid content forming the resin composition.

4. The resin composition according to claim 1 wherein the cross-linking agent (C) is an alicyclic epoxy compound.

5. The resin composition according to claim 1 further comprising a photoacid generator (D).

6. The resin composition according to claim 5 wherein the photoacid generator (D) is a quinone diazide compound.

7. The resin composition according to claim 1 wherein the binder resin (A) is a cyclic olefin polymer having a protic polar group,
    wherein the protic polar group is a group which contains an oxygen atom or nitrogen atom to which a hydrogen atom directly bonds.

8. The resin composition according to claim 1 wherein a ratio of content of the phenoxy resin (B) with respect to a total solid content forming the resin composition is 2 to 75 wt %.

9. The resin composition according to claim 1 wherein the phenoxy resin (B) is a phenoxy resin having a bisphenol structure.

10. An electronic device having a resin film comprised of a resin composition according to claim 1.

11. A resin composition comprising a binder resin (A), a phenoxy resin (B) having an hydroxyl equivalent of 300 or more, and a cross-linking agent (C), wherein the cross-linking agent (C) comprises a compound including two or more alkoxymethyl groups or methylol groups in its molecule and an alicyclic epoxy compound.

* * * * *